(12) United States Patent
Sekimura

(10) Patent No.: US 6,417,107 B1
(45) Date of Patent: *Jul. 9, 2002

(54) METHOD FOR MANUFACTURING A FUNCTIONAL DEVICE BY FORMING 45-DEGREE-SURFACE ON (100) SILICON

(75) Inventor: Masayuki Sekimura, Tokyo (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/335,703

(22) Filed: Jun. 18, 1999

(30) Foreign Application Priority Data

Jun. 18, 1998 (JP) .......................................... 10-171644

(51) Int. Cl.⁷ ...................... H01L 21/302; H01L 21/461
(52) U.S. Cl. ........................................ 438/689; 438/694
(58) Field of Search ................................ 438/689, 694, 438/50, 507, 693, 53; 134/2; 430/331

(56) References Cited

U.S. PATENT DOCUMENTS 5,793,153 A * 8/1998 Itoh et al. .................... 313/306
5,898,167 A * 4/1999 Musha et al. ............. 250/201.5
6,132,294 A * 10/2000 Lin .............................. 451/41

FOREIGN PATENT DOCUMENTS

JP 9-246254 9/1997

OTHER PUBLICATIONS

Bäckuland et al. (Optical Planes and Reflectors, Anisotropically Etched in Silicon, 7the Int. Conf. on Solid–State Sensors and Actuators, Yokohama, Japan, 1993, pp. 1031–1033).*

Ohwada et al. (Groove Depth Uniformization in (110) Si Anisotropic etching by Ultrasonic Wave and Application to Accelerator Fabrication, IEEE MEMS, 1995, pp. 100–105).*

Y. Bäcklund et al., "Optical Planes and Reflectors, Anisotropically Etched in Silicon", pp. 1031–1033, *The 7th International Conference on Solid–State Sensors and Actuators*, (1993).

K. Ohwada et al., "Groove Depth Uniformization in (110) Si Anisotropic Etching by Ultrasonic Wave and Application to Accelerometer Fabrication", pp. 100–105, *IEEE MEMS '95*, (1995).

C. Strandman et al., "Fabrication of 45° Optical Mirrors on (100)SI Using Wet Anisotropic Etching", pp. 244–249, *IEEE MEMS'95*, (1995).

* cited by examiner

Primary Examiner—Trung Dang
Assistant Examiner—Brook Kebede
(74) Attorney, Agent, or Firm—Foley & Lardner

(57) ABSTRACT

Conventional methods of forming a (111)-plane into a 45-degree-surface have employed a silicon wafer which requires a high processing cost, and methods utilizing an inexpensive (100) silicon wafer have not been successful in forming a 45-degree-surface having sufficient flatness. There is provided a method for manufacturing a semiconductor device preparing a substrate made of the (100) silicon wafer including steps of preparing a substrate made of the (100) silicon wafer, forming a pattern along a <100> direction of the (100) silicon, and etching with an anisotropic etchant using the pattern while applying an ultrasonic wave.

21 Claims, 12 Drawing Sheets

METHOD FOR MANUFACTURING A FUNCTIONAL DEVICE BY FORMING 45-DEGREE-SURFACE ON (100) SILICON

BACKGROUND

1. Field of the Invention

The present invention relates to a method for manufacturing a functional device, more particularly, to a method for manufacturing a functional device preferably having a substantially flat reflective surface or a V-shaped groove at an angle of 45 degrees relative to a (100)-plane of a silicon substrate on the substrate by utilizing a wet etching.

2. Description of the Related Art

Optical disk devices represented by CD-ROMs (Compact Disk-Read Only Memory), MOs Magneto-Optical disk) and DVDs (Digital Versatile Disk) which reproduce information by the use of laser beams having a predetermined wavelength are widely used. An optical head which forms a major component of an optical head apparatus includes a laser diode and a photodiode integrated thereon.

FIG. 1 is a perspective view showing a schematic configuration of an IOU (Integrated Optical Unit) 20, which is a type of functional device, a main portion of the optical head. The IOU 20 integrates a light-receiving element 24 that receives reflected light beam, a laser diode 25 that deflects the reflected light beam by 90 degrees by using a 45-degree-mirror 26 to emit an irradiated light beam 22, and the like on a silicon substrate 20.

FIG. 2 is a sectional view showing the laser diode 25 and the 45-degree-mirror 26. The irradiated light beam 22 emitted by the laser diode 25 mounted on the silicon substrate 21 is reflected by the 45-degree-mirror 26 to be deflected upward and is guided to an optical disk through a lens system (not shown). The 45-degree-mirror 26 that reflects the irradiated light beam 22 is fabricated by etching on a silicon substrate 21 and depositing a reflective film made of Al, Au or the like on a surface of the 45-degree-mirror 26.

Although the IOU 20 can be obtained in compact integrated form as a result, it has a serious problem in that a high cost is required for processing the silicon substrate 21 used therefor. The reason is that a (111)-plane is generally employed as the reflective surface of the 45-degree-mirror 26 and this requires a wafer having special specifications that are well known in the art by chemical companies that fabricate wafers.

A cut surface of a wafer sold as a "(100) silicon wafer" sliced from a silicon ingot is normally referred to as "(100)-plane".

As described, for example, by Kurt E. Peterson, Proceedings of the IEEE, vol. 70, No. 5, pp. 424 (1982) (which is incorporated herein by reference in its entirety), it is known that when the (100)-plane of the silicon substrate 21 is etched, a (111)-plane appears at an angle of exactly 54.74 degrees to the (100)-plane on the section of the silicon substrate 21 as shown in FIG. 3A. Because such a plane cannot be used as a 45-degree-mirror as it is, as shown in FIG. 3B, a silicon ingot 31 is sliced at an angle to obtain the (100) silicon wafer which is 9.74 degrees off, that is to make the angle exactly 45 degrees. The wafer is then etched to obtain a 45-degree-surface. It is difficult to control the inclination at the angle of 9.74 degrees accurately when the silicon ingot 31 is sliced. For example, when a round-bar ingot is sliced at an angle, the sliced part will have an elliptic configuration. Because the sliced wafer is difficult to process using a normal exposure apparatus if it remains in the elliptic configuration, a shaping operation is generally required to shape it into a circular configuration. Such a shaping operation involves much time and labor, resulting in a high cost. Further, the number of wafers available from one ingot 31 is small when they are obtained by slicing the wafers at an angle, and this also leads to a high cost. Presently, the cost of the 45 degree (100) wafer is at a level three or four times higher than that of normal (100) silicon wafers.

Attempts have been made to form the 45-degree-surface using a (100) silicon wafer which is less expensive. Specifically, a silicon substrate is patterned in a <100> direction as shown in FIG. 4 and is etched using an anisotropic etchant to form a surface at an angle of 45 degrees to the (100)plane of the silicon substrate, ie., the 45-degree-surface constituted by a (110)-plane.

In practice, however, the section becomes vertical instead of being at 45 degrees, as shown in FIG. 5, depending on the etchant used. Even when a 45-degree-surface is obtained, the surface has significant irregularities thereon such that it is difficult to achieve the desired RMS (Root Mean Square) of such a 45-degree-surface (i.e., 30 nm or less). Under such circumstances, there has been no report on successful formation of a smooth surface which can be used as a reflective surface Under some circumstances, a RMS of 30 nm or less is very important, for example, to read information on particular types of optical disks, such as DVD disks.

Backlund et al, Optical Planes and Reflectors, Anisotropically Etched in Silicon. 7th Int. Conf. On Solid-State Sensors and Actuator (Transducers 93) Yokohama, Japan, 1993, pp. 1031–1033 (which is incorporated herein by reference in its entirety) also describes chemical etching of silicon.

As described above, conventional functional devices and methods for manufacturing thereof have had a problem in that a 45-degree-surface has required a very high cost. Further, efforts toward the use of wafers at low cost have been unsuccessful in achieving desired configurations and operations.

SUMMARY OF THE INVENTION

The present invention has been made in view of the above-mentioned circumstances and intended to solve the above-mentioned problems. In particular, one object of the invention to provide a method for manufacturing a functional device with a 45-degree-surface formed by a (110)-plane using a (100) silicon wafer which is at a low cost.

The present invention provides a method for manufacturing a functional device including preparing a substrate made of a (100) silicon forming a pattern along a <100> direction of the (100) silicon, and etching with an anisotropic etchant using the pattern while applying an ultrasonic wave.

The present invention also provides a method for manufacturing a semiconductor device including preparing a substrate made of a (100) silicon, forming a pattern along a <100> direction of the (100) silicon and etching with an anisotropic etchant and a surface active agent.

Here, the surface formed by the etching step preferably has an angle of 45 degrees against the surface of the (100) silicon. The anisotropic etchant may include a surface active agent. The method may further comprise a step for coating a reflective material on the surface formed by the etching step.

Furthermore, the present invention provides a functional device including a (100) silicon, a pattern formed on the (100) silicon having a slanted surface along a <100> direction, wherein an RMS (Root Mean Square) of the slanted surface is 50 nm or less.

The present invention yet further provides an optical head apparatus, comprising, a light source that irradiates a light beam along a first direction, a reflector that reflects the light beam to a second direction, and an objective lens that receives the light beam from the reflector and condenses the light beam onto an optical recording medium, wherein the reflector is formed on a slanted surface along a <100> direction of a (100) silicon, and a RMS (Root Mean Square) of the slanted surface is 50 nm or less.

Further objects features and advantages of the invention will become apparent from the detailed description of preferred embodiments that follows.

BRIEF DESCRIPTION OF THE DRAWINGS

The accompanying drawings, which are incorporated in and constitute a part of this specification, illustrate several embodiments of the invention and, together with the description, serve to explain the principles of the invention.

DETAILED DESCRIPTION OF THE PREFERRED EMBODIMENTS

Preferred embodiments of a functional device and method for manufacturing thereof according to the present invention will now be specifically described in more detail with reference to the accompanying drawings. Wherever possibly the same reference numbers will be used throughout the drawings to refer to the same or like parts.

Figure 6:
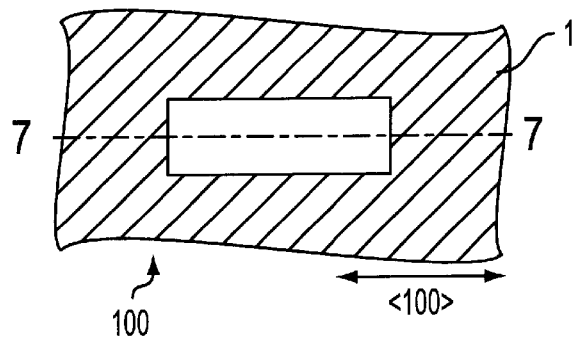
FIG. 6 is a plan view showing a mask pattern for illustrating a method for manufacturing a 45-degree-mirror according to an embodiment of the present invention.
Figure 7:
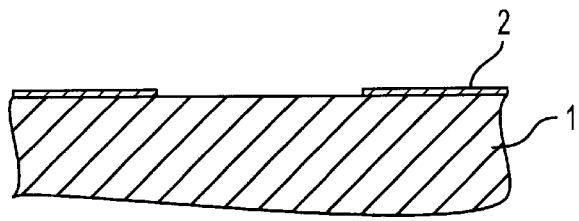
FIG. 7 is a sectional view taken along a line 7—7 of FIG. 6 of the 45-degree-mirror according to the first embodiment of the present invention.
Figure 8:
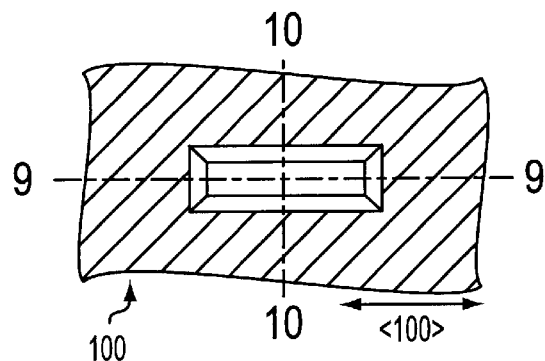
FIG. 8 is a plan view showing the 45-degree-mirror after etching according to the first embodiment of the present invention
Figure 9:
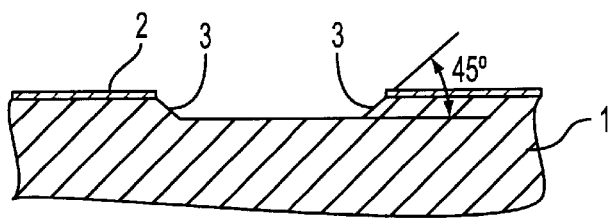
FIG. 9 is a sectional view showing the 45-degree-mirror after etching taken along a line 9—9 according to the first embodiment of the present invention.
Figure 10:
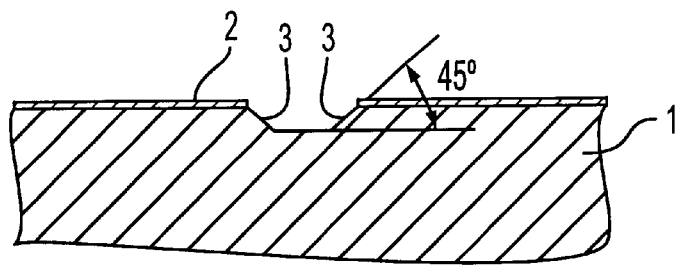
FIG. 10 is a sectional view showing the 45-degree-mirror after etching taken along a line 10—10 according to the first embodiment of the present invention.

A method for manufacturing a functional devices and in particular a method of manufacturing a 45-degree-surface made of silicon constituted by a (110)-plane according to the present invention will now be described with reference to FIGS. 6 to 10. FIG. 6 is a plan view of a mask pattern showing the fabrication of the 45-degree-surface, and FIG. 7 is a sectional view taken along a line A—A in FIG. 6. FIG. 8 is a plan view taken after etching. FIG. 9 is a sectional view taken along a line B—B in FIG. 8, and FIG. 10 is a sectional view taken along a line C—C in FIG. 8.

First, to form a 45-degree-surface, a mask layer 2 formed on a (100)plane of the silicon substrate 1 which is a (100)

silicon wafer is patterned as described below with reference to FIGS. 6 and 7. A <100> direction serves as a reference direction for the patterning. The <100> direction here implies four directions [100], [−100], [010] and [−010] because the <100> direction is considered here only in the (100)-plane. Generally, a silicon oxide film or a silicon nitride film is used as the mask layer 2. The substrate is etched using an anisotropic etchant containing a surface active agent with an ultrasonic wave applied thereto. An aqueous solution of potassium hydroxide (KOH) or tetramethylammonium hydroxide (TMAH) or the like can be used as the anisotropic etchant. The surface active agent is preferably a non-ion type surface active agent such as a high purity cleaning agent (product name: NCW-601A), containing 30% of polyoxyethylene alkyl phenyl ether, manufactured by WAKO Pure Chemical Corporation. The amount of the non-ion type surface active agent added to the alkali aqueous solution can advantageously be between 0.01% and 10% by weight. preferably between 0.5% and 5% by weight, based on the weight of the above-mentioned KOH or TMAH. If the amount of non-ion type surface active agent is less than 0.01% by weight, it may become difficult to decrease the etching rate of the (100)-plane or (111)-plane of the silicon substrate In contrast, if the amount of non-ion type surface active agent is more than 10% by weight, etching function by the alkali aqueous solution may be restrained under some conditions.

A suitable method of applying the ultrasonic wave is as follows. An anisotropic etchant in which the surface active agent is added, is filled in a ultrasonic washer. The bottom of the ultrasonic washer is equipped with a piezoelectric transducer, for example, and the (100) silicon wafer is dipped with its surface being parallel to vertical direction. The power applied to the piezoelectric transducer may be approximately 100 W in the case, for example, the amount of the anisotropic etchant is between 3000 cc and 4000 cc and the silicon substrate is less than 10 centimeters. The power to be applied may be greater, in the case when the amount of the anisotropic etchant is larger, or the size of the silicon wafer is larger, for example, when a pre-dicing wafer with a large diameter is processed. In accordance with the present invention, both a single frequency of the ultrasonic wave can be applied or a plurality of frequencies thereof can be applied by switching periodically. It may be preferable in some instances, to apply a plurality of frequencies by switching periodically, so as to prevent partial etching of the silicon substrate by the influence of a standing wave, or to prevent the dependency in which a frequency generates a particular etching shape.

Etching under such conditions will provide a 45-degree-surface 3 constituted by a (110)-plane as shown in FIGS. 8 to 10.

Figure 3A:
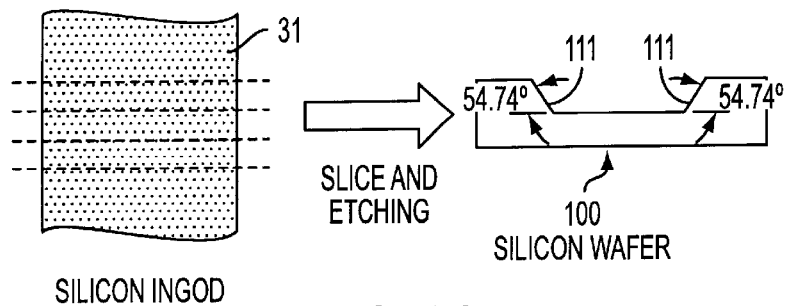
FIGS. 3A and 3B are explanatory illustrations showing a method for forming the 45-degree-mirror constituted by a (111)-plane according to a conventional technology.
Figure 3B:
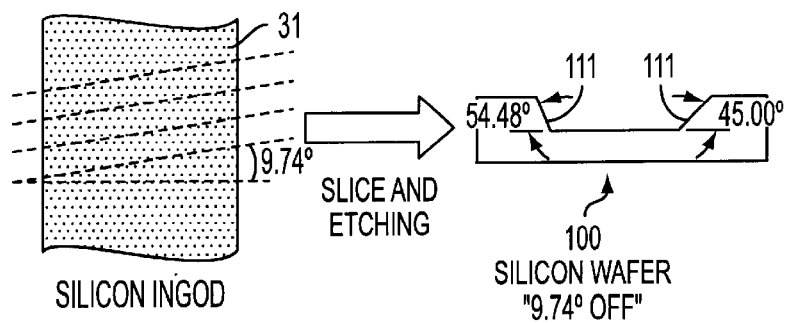
Figure 4:
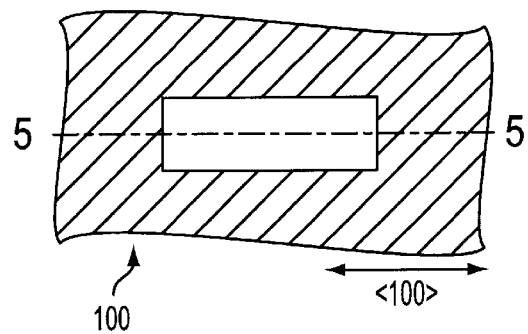
FIG. 4 is a plan view showing a mask pattern for forming the 45-degree-mirror constituted by a (110)-plane according to the conventional technology.

Conventional technology, such as shown in FIG. 3B, has provided a 45-degree-surface constituted by a (111)-plane on one side of the (100) silicon wafer which is "9.74 degrees off". The surface on the other side has been at an angle in the excess of 60 degrees. In contrast, the present invention is characterized in that the other side will be also at an angle of 45 degrees, i.e., both sides are at an angle of 45 degrees, and in that another 45-degree-surface 3 is formed in the direction orthogonal thereto as shown in FIG. 10.

Figure 5:
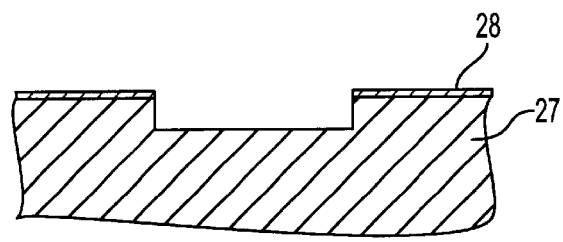
FIG. 5 is an example of a sectional view taken along a line 5—5 of FIG. 4 after etching according to the conventional technology.

Further, when no surface active agent is added to the anisotropic etchant and no ultrasonic wave is applied, as shown in FIGS. 5 and 6, the section will be vertical instead of being at the angle 45 degrees, or the 45-degree-surface appears locally. In contrast, the present invention will provide a 45-degree-surface 3 with certainty.

In forming the masking pattern, it is important to align the pattern in the <100> direction. A shift of the pattern by only 1 degree in the <100> direction will result in irregularities in the form of stripes in the vertical direction of a resultant 45-degree-surface, which will be therefore unavailable as a reflective mirror.

In order to prevent the formation of such irregularities, a highly accurate orientation in the <100> direction must be achieved. A known approach for achieving such orientation is the use of a fan-shaped pattern (not shown) which provide. highly accurate orientation in the <110> direction.

Because the <100> direction crosses the <110> direction at an angle of 45 degrees, accurate orientation in the <100> direction can be achieved by rotating the wafer at 45 degrees, by using the above-explained fan-shaped pattern. Alternatively, the mask pattern may be rotated at 45 degrees when it is lithographed during fabrication to achieve accurate orientation by aligning it in the <110> direction serving as the reference direction.

An example of a suitable process for manufacturing a 45-degree-mirror including the orientation step will be described with reference to FIGS. 11 and 12. This is a case in which the pattern is lithographed at a rotation of 45 degrees. the <110> direction serving as the reference direction.

Figure 11:
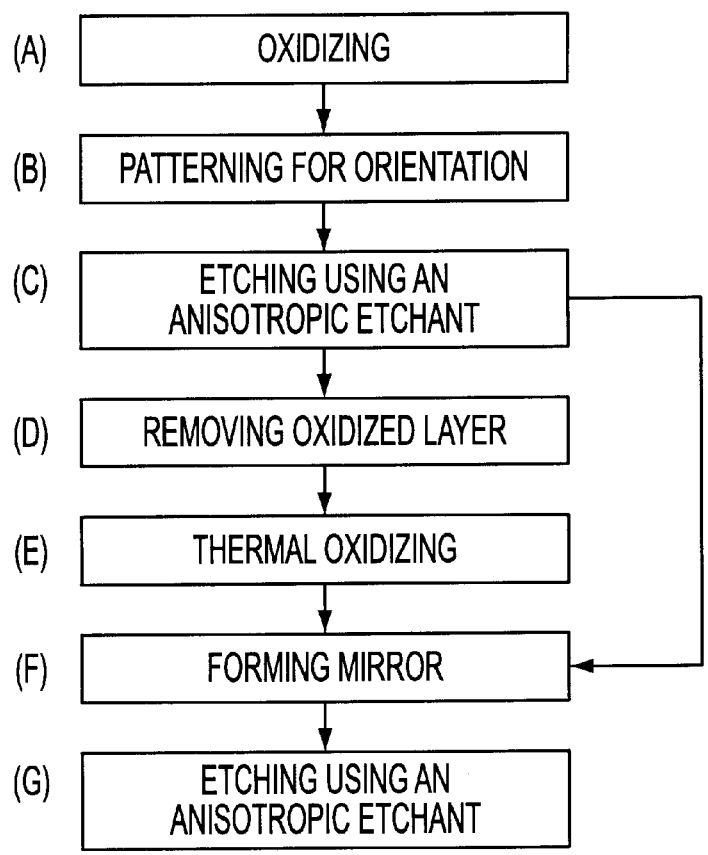
FIG. 11 is a flow chart showing manufacturing processes for the 45-degree-mirror according to the first embodiment of the present invention.
Figure 12:
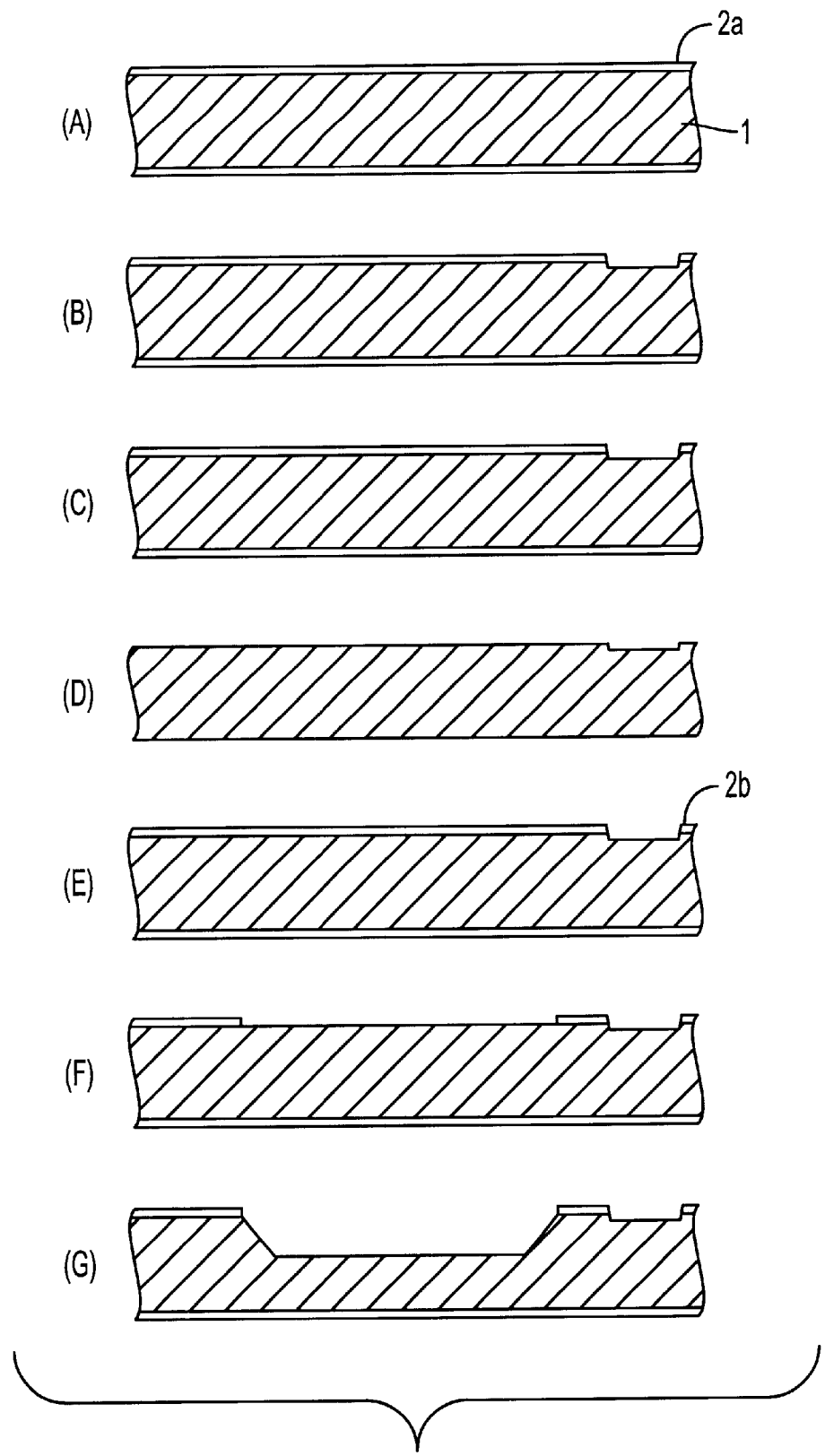
FIG. 12 is sectional view taken at respective processes on the 45-degree-mirror according to the embodiment of the present invention.

FIG. 11 shows a process flow chart, and FIG. 12 shows sections of a part of a substrate where the mirror is formed, taken at respective processes. In FIG. 12, a pattern for orientation and a pattern for forming the mirror are shown in the same sections for convenience in illustration, although they are rarely included in the same section in practice.

(1) As shown in step (A) in FIGS. 11 and 12, the substrate 1 is thermally oxidized to form a mask layer 2*a*.

(2) As shown in step (B) in FIGS. 11 and 12. patterning for orientation to the <110> direction is performed on the mask layer 2*a*.

(3) After the patterning, etching is performed using an anisotropic etchant as shown in step (C) in FIGS. 11 and 12.

(4) As shown in step (D) in FIGS. 11 and 12, the mask layer 2*a* is removed after the etching for orientation.

(5) After removing the mask layer 2*a*, as shown in step (E) in FIGS. 11 and 12, thermal oxidization is carried out again to form a mask layer 2*b*. The steps shown in step (D) and step (E) in FIGS. 11 and 12 are performed to renew the mask layer and may therefore be deleted.

(6) As shown in step (F) in FIGS. 11 and 12, the pattern for forming the mirror is formed at proper orientation (7) As shown in step (G) in FIGS. 11 and 12, the substrate 1 is etched by using an anisotropic etchant added with a surface active agent while applying an ultrasonic wave.

The 45-degree-surface is completed according to the above-described steps.

In order to obtain a practical reflective mirror, the silicon is coated with a reflective film material such as Al, Au or the like on the spice thereof because it ha originally a low reflectivity.

Figure 13A:
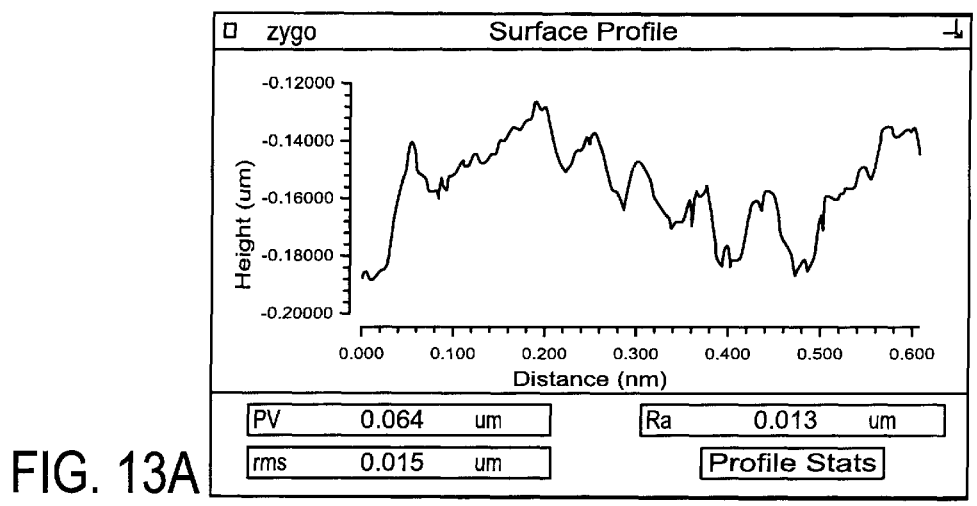
FIGS. 13A, 13B and 13C are state diagrams (results of measurement using a three-dimensional non-contact measuring device) of the surface of the 45-degree-mirror according to the embodiment of the present invention.

FIG. 13A shows the result of measurement of the condition of the 45-degree-surface formed by using the aqueous solution containing 22% TMAH containing 1% NCW-601A as the surface active agent and by applying the ultrasonic wave at three frequencies of 28 kHz, 45 kHz and 100 kHz each having a duration of 1 second on a switched basis. The measurement was carried out using a three-dimensional non-contact measurement device, and one section of the 45-degree-surface, i.e., the measured surface, is shown in this Figure. It is apparent that a smooth surface at $\lambda/30$ or less is obtained where the RMS is 20 nm or less and the wavelength λ is 633 nm provided by a He—Ne laser.

Figure 13B:
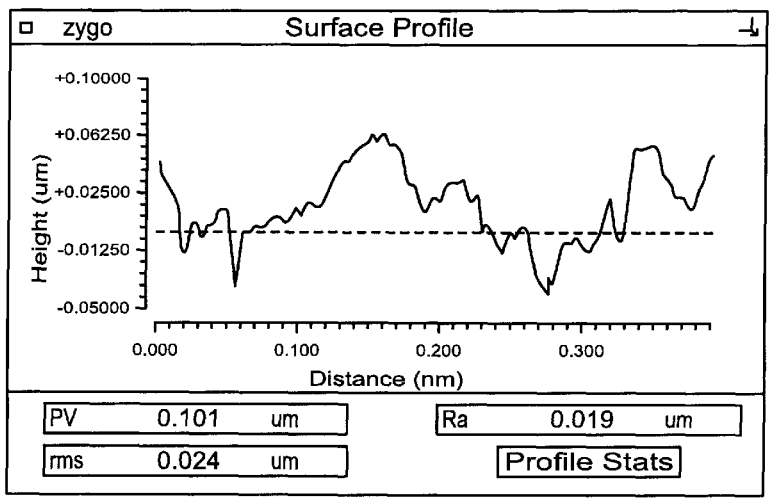

FIG. 13B shows the result of measurement of the condition of the (110) surface fabricated through an etching process that uses the anisotropic etchant containing no surface active agent and applies the ultrasonic wave. The measurement was made using the three-dimensional non-contact measuring device, and one section of the measured surface is shown in this figure. FIG. 13B indicates that a surface as smooth as λ/20 or less compared to those available with the conventional technology can be obtained without adding the surface active agent where the RMS is 24 nm, that is 30 nm or less, and the wavelength λ is 633 nm provided by a He—Ne laser.

It is useful in some embodiments to apply the ultrasonic wave at three frequencies of 28 kHz, 45 kHz and 100 kHz, each having a duration of 1 second on a switched basis. Any frequencies can be used. A combination in which a "standing wave" is generated should generally be avoided. In addition, multiples of the same frequency, for example, 28 kHz, 56 kHz and 112 kHz should be avoided. A wavelength λ is 633 nm provided by a He—Ne laser and is suitable wavelength. Wavelength of less than 400 nm, which is less than the wavelength of blue semiconductor laser, can also be used according to some embodiments of the present invention.

A RMS of 20 nm or less is preferable in some embodiments so that a smooth surface at λ/30 or less can be obtained. According to the Maréchal Criterion (which designates the RMS using a standard designation for a mirror and a lens) a RMS value<0.07 (or λ/14) is an advantageous range. If the wavelength is λ=633 nm (He—Ne laser), the resultant RMS is 633/14=45 nm. If the wavelength used is λ=400 nm (blue semiconductor laser), the RMS is 400/14= 29 nm. These values change depending on the number of optical elements. Based on the principles according to the present invention, the RMS is preferably RMS<λ/20, and the derived value at these wavelengths are 30 nm and 20 nm respectively.

Figure 13C:
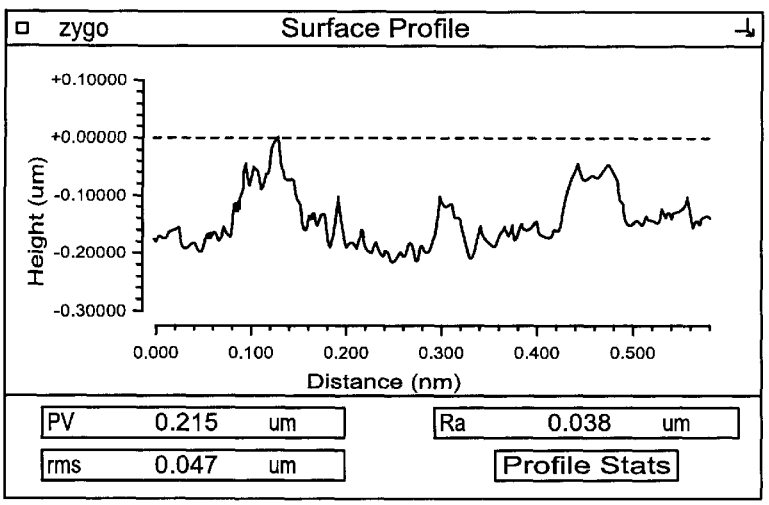

It is possible to obtain the 45-degree-surface with respect to the (100) silicon wafer, in the case when the surface active agent is added to the anisotropic etchant and the ultrasonic wave is not applied. The RMS of the 45-degree-surface in this case is 47 nm, that is 50 nm or less, as shown in FIG. 13C.

As described above, the present invention makes it possible to form the 45-degree-surface in a preferable surface condition on an inexpensive (100) silicon wafer. In addition, the 45-degree-surface facing four directions can be formed as shown in FIG. 8. This feature makes it possible to provide various types of functional elements as described below. The present invention may be applied to processing of not only the reflective mirror but also a V-shaped groove Especially, the V-shaped groove formed using this method allows an object having corners at right angles as described later to be secured therein with stability, because its bottom defines an angle of 90 degrees. If necessary, a groove at an angle of 70.52 degrees may be formed which is the same as the V-shaped groove according to the conventional technology constituted by the (111)-plane.

By applying the ultrasonic waves, the surface active agent, or the surface active agent as well as the ultrasonic waves to the anisotropic etchant, the flat 45-degree-surface on the (100) silicon wafer can be obtained However, the etched amount on side edges to the mask layer 2 is larger when the surface active agent is not added to the etchant, in comparison with the case when the surface active agent is added thereto. As the etched amount on side edges becomes larger, the displacement between the mask layer 2 and the 45-degree-mirror becomes also lower, thereby causing the position control of the 45-degree-mirror difficult. Therefore, it is desirable to add the surface active agent to the etchant, further add the ultrasonic waves thereto if necessary, to control the position of the 45-degree-mirror precisely.

Some modifications according to the present invention will now be described below.

(First Modified Embodiment)

Figure 14:
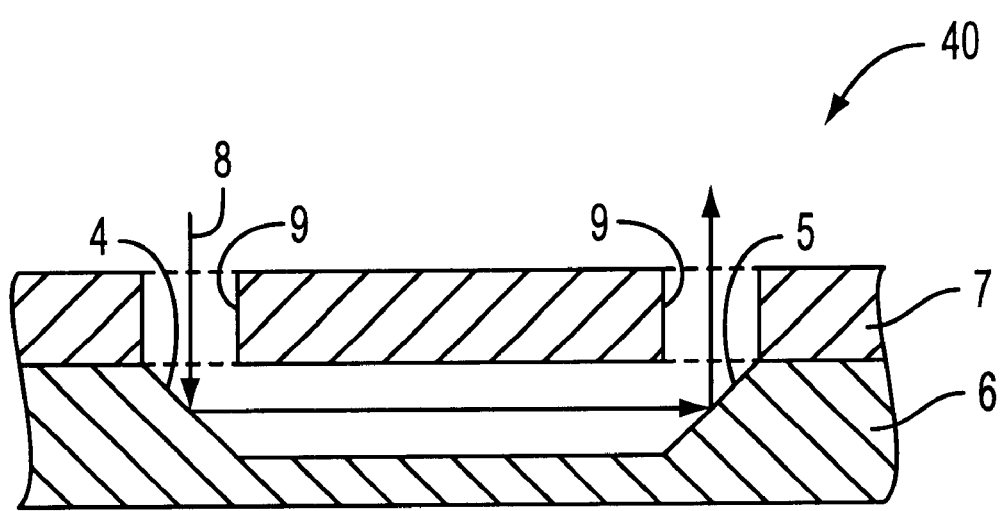
FIG. 14 is a sectional view showing a beam deflecting element utilizing the 45-degree-mirror according to a first modified embodiment of the present invention.

A first modified embodiment according to the present invention relates to a beam deflecting element which will be described with reference to FIG. 14 and 15. FIG. 14 is a sectional view showing the deflecting element 40 which includes a mirror substrate 6 formed by a first 45-degree-mirror 4 and a second 45-degree-mirror 5 facing each other and a shading substrate 7 laminated thereon having holes 9 to allow the entrance of light beam. The masking layer is omitted in this figure, and will be omitted hereinafter unless otherwise stated.

When light beam impinges upon the first 45-degree-mirror 4 from above through the hole 9 in the shading substrate 7, the incident light beam 8 is reflected by the first 45-degree-mirror 4. The light beam is further reflected by the second 45-degree-mirror 5 to travel upward through the hole 9 in the shading substrate 7. It is thus possible to fabricate a beam deflecting element 40 which is a combination of two 45-degree-mirrors.

Figure 15:
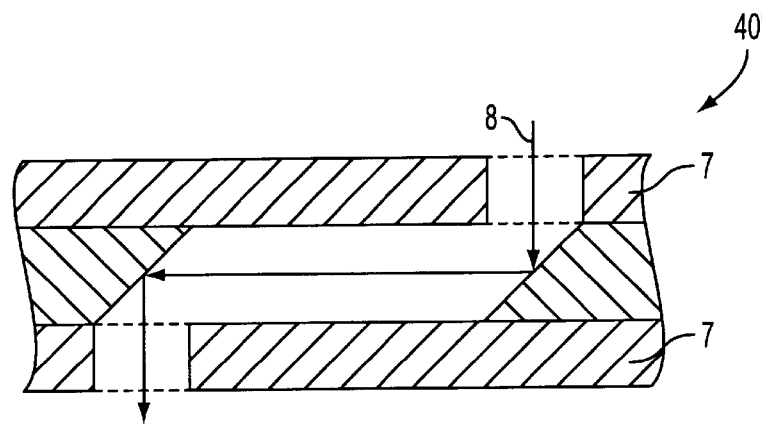
FIG. 15 is a sectional view showing the beam deflecting element utilizing the 45-degree-mirror according to the first modified embodiment of the present invention.

As shown in FIG. 15, the mirror substrate 6 may be etched from both sides thereof to form the first 45-degree-mirror 4 and the second 45-degree-mirror 5 in parallel with each other. When light beam impinges the first 45-degree-mirror 4 from above, the incident light 8 is reflected by the first 45-degree-mirror 4 and then by the second 45-degree-mirror 5 to be emitted downward It is thus possible to form a beam deflecting element 40' which is a combination of two 45-degree-mirrors In this embodiment, the masking substrate 7 is laminated on both sides of the mirror substrate 6.

(Second Modified Embodiment)

Figure 16:
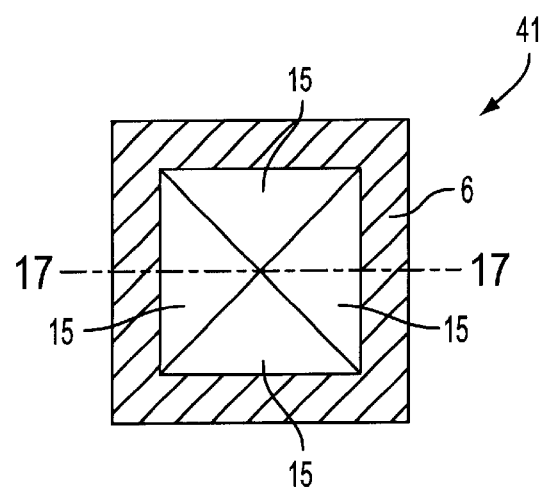
FIG. 16 is a plan view showing an other beam deflecting element utilizing the 45-degree-mirror according to a second modified embodiment of the present invention.
Figure 17:
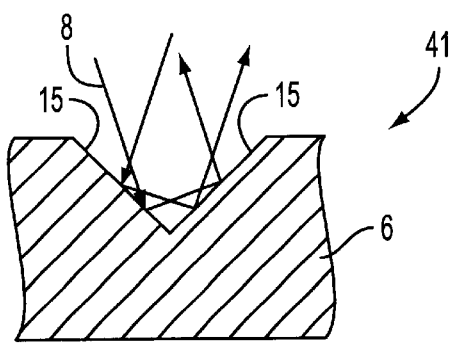
FIG. 17 is a sectional view taking along a line 17—17 of FIG. 16, showing the beam deflecting element utilising the 45-degree-mirror according to the second modified embodiment of the present invention.
Figure 18:
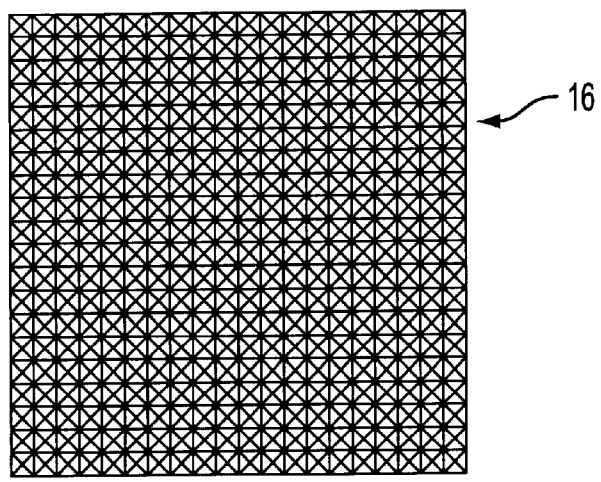
FIG. 18 is a plan view showing the deflection mirror array utilizes 45-degree-mirrors according to the second modified embodiment of the present invention.

A second modified embodiment according to the present invention relates to a beam deflecting element which is a different type from that of the first modified embodiment, and will be described with reference to FIGS. 16, 17 and 18. FIGS. 16 and 17 are a plan view and a sectional view showing a deflecting element 41 in which four 45-degree-mirrors 15 are formed on the mirror substrate 6 in a pyramid-like configuration. In such a structure, the incident light 8 returns in the direction of incidence as shown in FIG. 17. It is therefore possible to form the 45-degree-mirrors 15 which reflect the incident light 8 in the direction of incidence even if the angle at which they face each other is changed. If a multiplicity of such 45-degree-mirrors are arranged side by side as shown in FIG. 18 such that flat portions around concave portions of such 45-degree-mirrors are reduced as much as possible to form a mirror array 16, there is provided a mirror which allows a viewer to look at himself or herself from wherever other than in front he or she views the mirror. The mirror array 16 can be also modified to a corner cube reflector.

(Third Modified embodiment)

Figure 19:
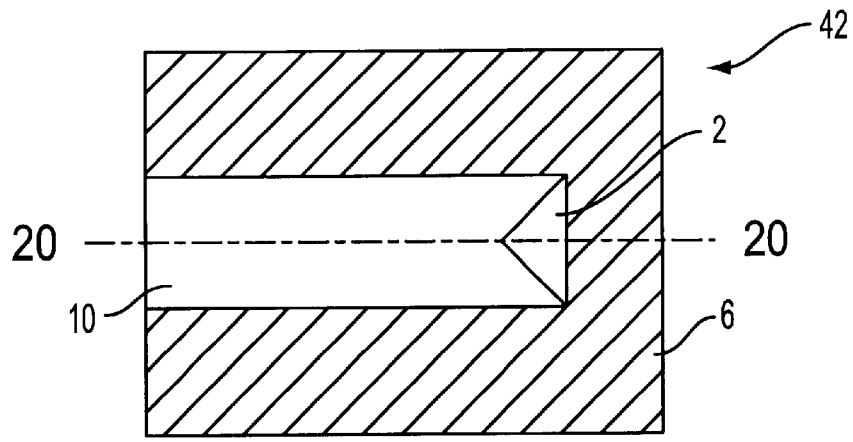
FIG. 19 is a plan view showing a 45-degree-mirror having a V-shaped groove according to a third modified embodiment of the present invention
Figure 20:
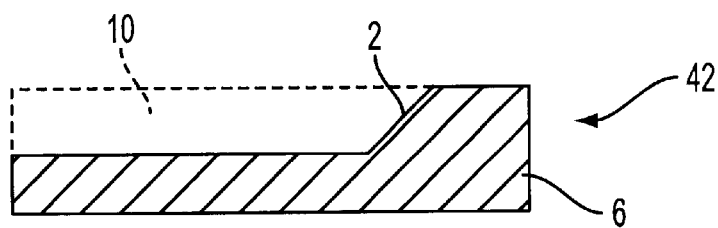
FIG. 20 is a sectional view showing the 45-degree-mirror having the V-shaped groove taken alone a line 20—20 according to the third modified embodiment of the present invention.
Figure 21:
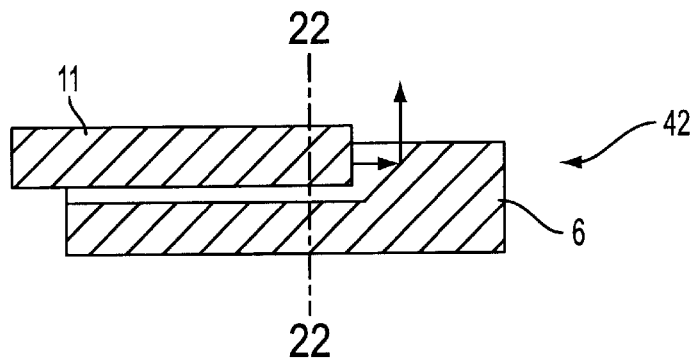
FIG. 21 is a sectional view showing the 45-degree-mirror having the V-shaped groove to which an optical fiber is secured, taken along the line E—E according to the third modified embodiment of the present invention.
Figure 22:
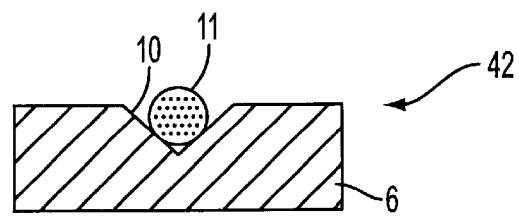
FIG. 22 is a sectional view showing the 45-degree-mirror having the V-shaped groove to which the optical fiber is secured, taken along a line 22—22 according to the third modified embodiment of the present invention.

A third modified embodiment according to the present invention relates to yet another example of a beam deflecting element 42, on the formation of a 45-degree-mirror having a V-shaped groove which will be described with reference to FIGS. 19 to 22. FIGS. 19 and 20 are a plan view and a sectional view, respectively, showing the 45-degree-mirror 2 in which a V-shaped groove 10 for securing an optical fiber is formed on a 45-degree mirror 2. FIGS. 21 and 22 are sectional views showing a state in which an optical fiber 11 is secured.

Figure 23:
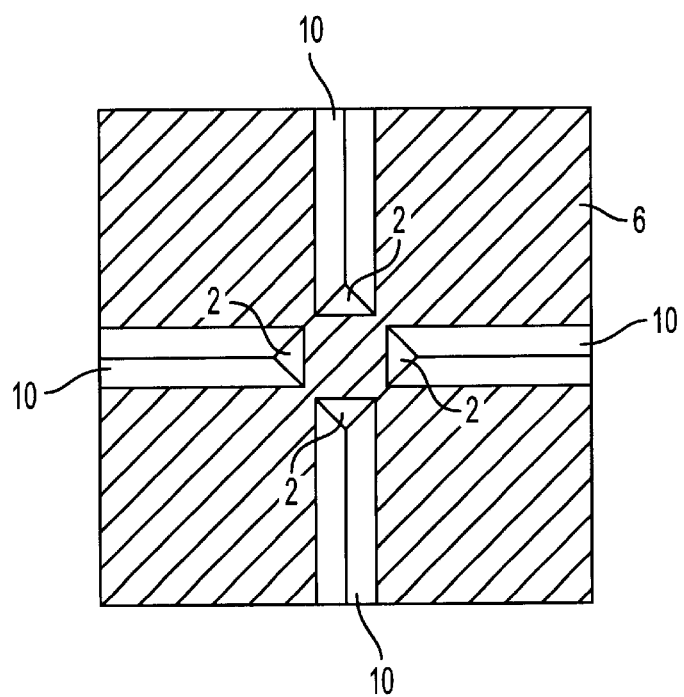
FIG. 23 is a plan view showing 45-degree-mirrors having V-shaped grooves to which four optical fibers are secured according to the third modified embodiment of the present invention.

Another advantage of the third modified embodiment is that the 45-degree-mirrors 2 having the V-shaped grooves 10 can be formed in the four (upper, lower, right and left) directions and that the optical fibers 11 (not shown here) can be secured in the four directions as shown in the plan view in FIG. 23.

Figure 1:
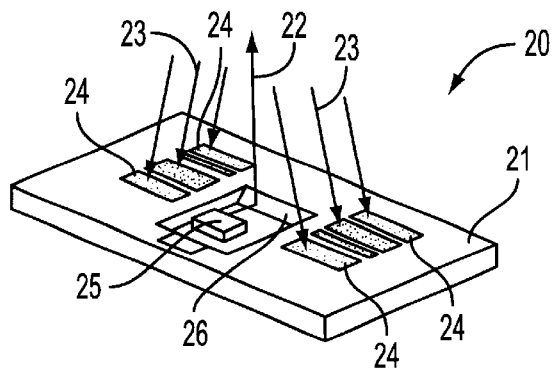
FIG. 1 is a perspective view showing a structure of a conventional IOU.
Figure 2:
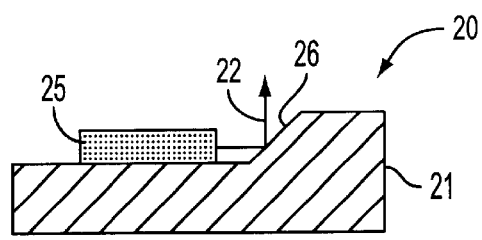
FIG. 2 is a schematic sectional view showing a 45-degree-mirror and a laser of the conventional IOU.
Figure 24:
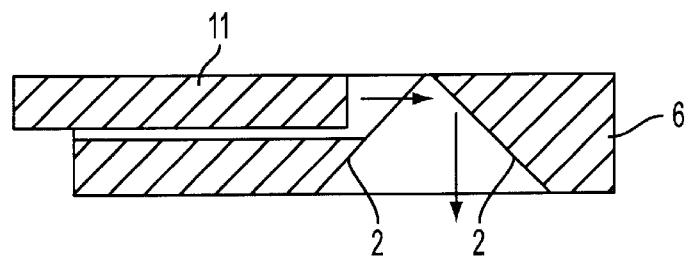
FIG. 24 is a sectional view showing the 45-degree-mirror having a V-shaped groove to which the optical fibers are secured according to the third modified embodiment of the present invention.

Further, as shown in FIG. 24, the mirror substrate 6 may be processed from both sides thereof to form downwardly facing mirrors 2, thereby making it possible to deflect light beam through the optical fiber 11 downward.

(Fourth Modified Embodiment)

Figure 25:
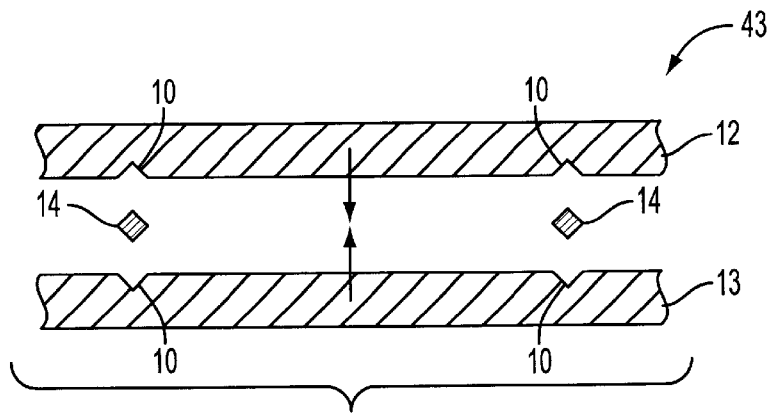
FIG. 25 is a sectional view showing the lamination of a substrate according to a fourth modified embodiment of the present invention.

A fourth modified embodiment according to the present invention relates to an example of an element 43, having V-shaped grooves for positioning two substrates during lamination of them. FIG. 25 is a sectional view showing the fourth modified embodiment V-shaped grooves 10 are formed in predetermined positions on the surfaces of substrates 12 and 13 along which they are laminated. When the two substrates 12 and 13 are laminated, they are positioned relative to reach other by fitting spacers 14 having, for example, a square section, into the V-shaped grooves 10.

Although there is a possible method for aligning the V-shaped grooves wherein an optical fiber, as a spacer, is fitted into V-shaped grooves formed by (111)-planes, this method does not provide suitable accuracy in alignment if the cross section shape is circular. On the other hand, according to this modified embodiment, the V-shaped grooves form at an angle of 90 degrees, which allows an exact fit of a square spacer and thus allows accurate alignment. Further, the square spacer is easy to produce.

(Fifth Modified Embodiment)

Figure 26:
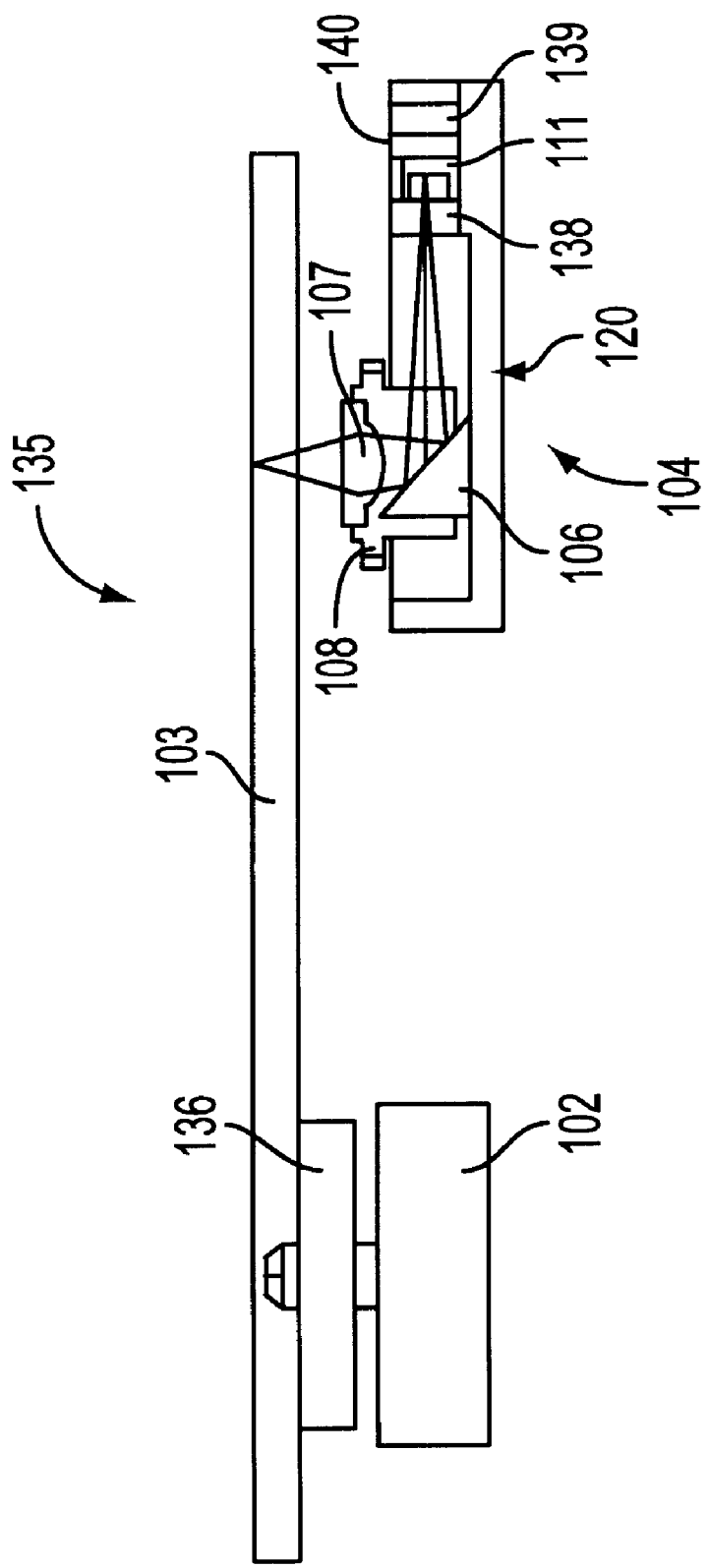
FIG. 26 is a sectional view showing an internal structure of an optical head apparatus according to a fifth modified embodiment of the present invention.
Figure 27:
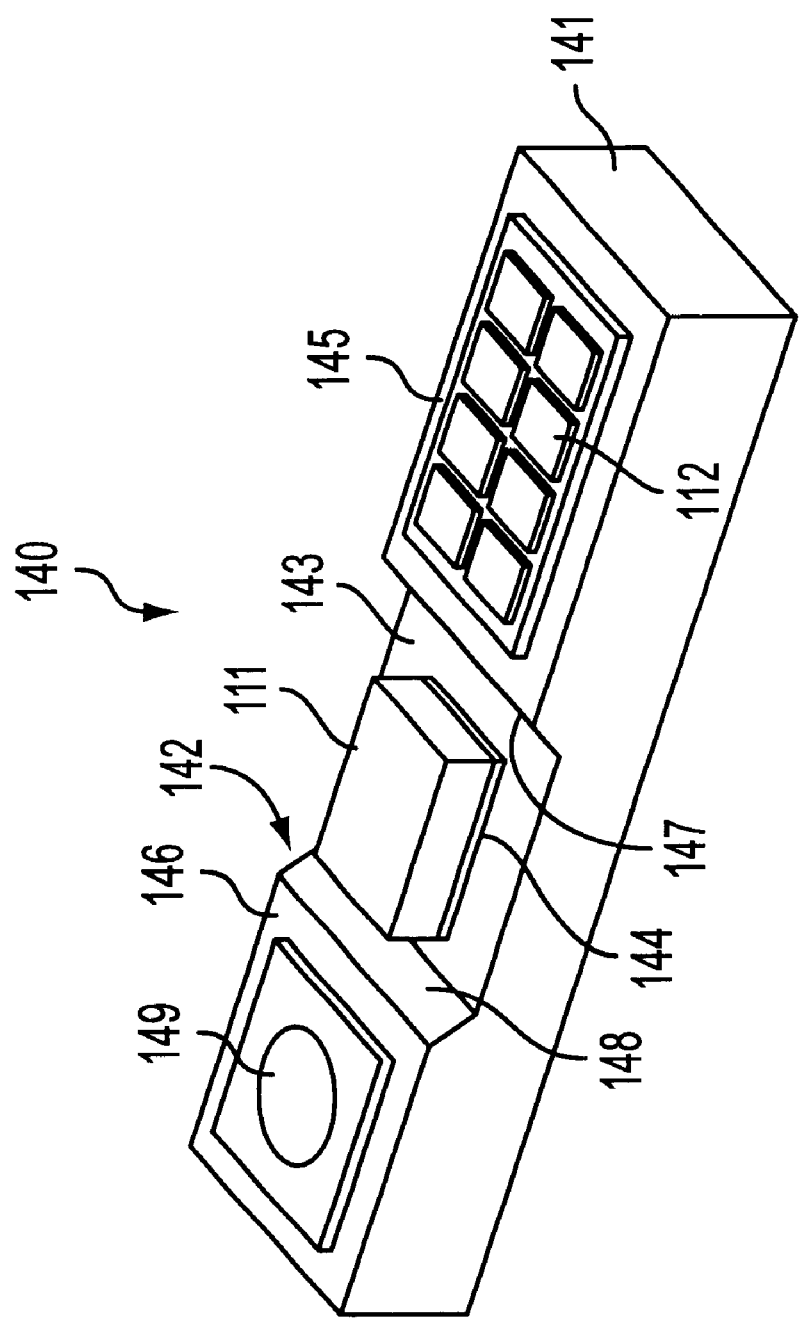
FIG. 27 is a perspective view showing an overall structure of an integrated optical device mounted on the optical head apparatus according to the fifth modified embodiment of the present invention.

A fifth modified Embodiment which is a modification to an optical head apparatus, is explained with reference to FIGS. 26 and 27. FIG. 26 is a sectional view showing an internal structure of the optical head apparatus, and FIG. 27 is a perspective view showing the overall structure of an integrated optical device. In FIG. 26, a mechanism for driving an objective lens and the like is not shown.

The optical head apparatus 135 is equipped with a spindle motor 102 coupled with a stable base portion (not shown), a chucking mechanism 136 such as a magnetic chucking mechanism connected to the spindle motor 102. and a disk 103 for recording and/or reproducing information such as CD-ROM, MO and DVD held by the chucking mechanism 136. The disk 103 is rotated stably by the spindle motor 102 while recording/reproducing.

At the lower surface of the disk 103, there is provided a carriage 120 and an optical head 104 is mounted thereon. The optical head 104 is equipped with an integrated optical device 140 having an optical source and a photo-detector, a reflecting mirror 106 that reflects a light beam irradiated from the light source to the direction orthogonal to the surface of the disk 103 and reflects a light beam reflected by the disk 103 to the photo-detector, an objective lens 107 disposed on the upper portion of the optical head 104 facing the recording surface of the disk 103 for condensing the light beam from the reflecting mirror 106 to the recording surface of the disk 103 thereby generating a beam spot thereon. and an objective lens holder 108 that holds the objective lens 107. In the vicinity of the integrated optical device 140, there is provided a HOE (Holographic Optical Element) 138 that diffracts the light beam irradiated by the light source. A semiconductor laser 111 as the optical source is disposed on front side of the integrated optical device 140, a heat sinks 139 having a plurality of protruding portions for improving heat radiation is disposed on back side thereof.

The integrated optical device 140 according to the present modification will be explained in detail with reference to FIG. 27. As shown in the figure the integrated optical device 140 is equipped with a plate 141 made of a silicon, the semiconductor laser 111 disposed on a bottom surface 143 of a concave portion 142 through a thin layer 144, a photo-detector 112 disposed on one surface of a convex portion 145 of the plate 141, and an APC (Automatic Power Control) photo detector 149 disposed on the other surface of the convex portion 145 of the plate 141. The concave portion 142 has slanted portions 147 and 148 between convex portions 145 and 146 and the concave portion 142. A reflecting layer such as a metal thin layer and a dielectric multi-layer is deposited on the slanted portions 147 and 148 thereby forming a mirror surface for reflecting the light beam. Note that the photo-detector 112 is required so as to reproduce a recorded signal on the disk 103, and to control the position of a focal point of the objective lens 107 on the disk 103. In contrast, the APC photo-detector 149 is required so as to control the output of the semiconductor laser 111, by feeding back the output of the APC photo-detector 149 to the semiconductor laser 111.

Here, the concave portion 142 is formed, as described above, by etching the surface of the (100) silicon wafer, while using the isotropic etchant such as KOH. The ultrasonic waves, the surface active agent, or the surface active agent as well as the ultrasonic waves should preferably be applied to the anisotropic etchant in this process. By etching the (100) silicon wafer in such a manner, the slanted portions 147 and 148 are inclined 45 degrees accurately to the bottom surface 143, and have flat surfaces.

It is apparent from the above that the present invention makes it possible to form a 45-degree-surface having excellent surface condition using an inexpensive (100) silicon wafer.

The foregoing discussion disclosed and describes only several exemplary embodiments of the present invention. As will be understood by those skilled in the an, the present invention may be embodied in other specific forms without departing from the spirit or essential characteristics thereof. Accordingly, the disclosure of the present invention is intended to be illustrative, but not limiting of the scope of the invention, the metes and bounds of which are set forth in the following claims. The entire contents of Japanese Patent Application H10-171644, filed Jun. 18, 1998, is incorporated herein by reference in its entirely.

What is claimed is:

1. A method for manufacturing a semiconductor device, comprising:

preparing a substrate made of a (100) silicon;

forming a pattern along a <100> direction of the (100) silicon; and etching with an anisotropic etchant to form a surface using the pattern while applying an ultrasonic wave, wherein the anisotropic etchant includes a surface active agent having a concentration of 0.01 to 10% by weight based on the weight of the anisotropic etchant.

2. The method according to claim 1, wherein the surface formed by the etching includes a (110) surface.

3. The method according to claim 1, wherein the surface formed by the etching has an angle of 45 degrees with respect to a surface of the (100) silicon.

4. The method according to claim 1, wherein the surface active agent includes a non-ion type surface active agent.

5. The method according to claim 4, wherein the surface active agent comprises polyoxyethylene alkyl phenyl ether.

6. The method according to claim 1, wherein the ultrasonic wave is applied at three frequencies.

7. The method according to claim 6, wherein the ultrasonic wave is applied at frequencies of 28 kHz, 45 kHz and 100 kHz.

8. The method according to claim 7, wherein the frequencies each have a duration of about 1 second.

9. The method according to claim 1, further compromising coating the substrate with a reflective film.

10. The method according to claim 9, wherein the reflective film comprises one of Al or Au.

11. The method according to claim 1, wherein the anisotropic etchant comprises an aqueous solution of potassium hydroxide or tetramethylammonium hydroxide.

12. The method according to claim 1, wherein the surface active agent is present in a concentration of 0.01 to 5% by weight based on the weight of the anisotropic etchant.

13. A method for manufacturing a semiconductor device, comprising:

preparing a substrate made of a (100) silicon;

forming a pattern along a <100> direction of the (100) silicon; and etching with an anisotropic etchant and a surface active agent to form a surface, wherein the surface active agent has a concentration of 0.01 to 10% by weight based on the weight of the anisotropic etchant.

14. The method according to claim 13, wherein the surface formed by the etching includes a (110) surface.

15. The method according to claim 13, wherein the surface formed by the etching has an angle of 45 degrees a surface of the (100) silicon.

16. The method according to claim 13, wherein the surface active agent includes a non-ion type surface active agent.

17. The method according to claim 16, wherein the surface active agent comprises polyoxyethylene alkyl phenyl ether.

18. The method according to claim 13, further comprising coating the substrate with a reflective film.

19. The method according to claim 18, wherein the reflective film comprise one of Al or Au.

20. The method according to claim 13, wherein the anisotropic etchant comprises an aqueous solution of potassium hydroxide or tetramethylammonium hydroxide.

21. The method according to claim 13, wherein the surface active agent is present in a concentration of 0.01 to 5% by weight based on the weight of the anisotropic etchant.

\* \* \* \* \*